United States Patent
Goss et al.

(10) Patent No.: US 8,806,106 B2
(45) Date of Patent: Aug. 12, 2014

(54) ESTIMATING WEAR OF NON-VOLATILE, SOLID STATE MEMORY

(75) Inventors: Ryan James Goss, Lakeville, MN (US); David Scott Seekins, Shakopee, MN (US); David Scott Ebsen, Minnetonka, MN (US); Navneeth Kankani, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 827 days.

(21) Appl. No.: 12/945,496

(22) Filed: Nov. 12, 2010

(65) Prior Publication Data

US 2012/0124273 A1   May 17, 2012

(51) Int. Cl.
*G06F 12/00* (2006.01)

(52) U.S. Cl.
USPC ............................................... 711/103

(58) Field of Classification Search
CPC .................................................. G06F 12/0246
See application file for complete search history.

(56) References Cited

U.S. PATENT DOCUMENTS

| | | | |
|---|---|---|---|
| 2009/0157952 A1* | 6/2009 | Kim et al. | 711/103 |
| 2010/0061207 A1 | 3/2010 | Trantham | |
| 2040/0174849 | 7/2010 | Walston et al. | |
| 2011/0078402 A1* | 3/2011 | Sato | 711/166 |

* cited by examiner

*Primary Examiner* — Reginald Bragdon
*Assistant Examiner* — Baboucarr Faal
(74) *Attorney, Agent, or Firm* — Hollingsworth Davis, LLC

(57) ABSTRACT

Completion times of data storage operations targeted to a non-volatile, solid-state memory device are measured. Wear of the memory device is estimated using the measured completion times, and life cycle management operations are performed to affect subsequent wear of the memory device in accordance with the estimated wear. The life cycle management may include operations such as wear leveling, predicting an end of service life of the memory device, and removing worn blocks of the memory device from service.

18 Claims, 9 Drawing Sheets

| | PHASE | | | |
|---|---|---|---|---|
| | PRE-PRODUCTION 302 | MANUFACTURING 303 | IN-USE 304 | POST MORTEM 305 |
| DEVICES TESTED 306 | ENGINEERING PROTOTYPES, TEST UNITS | SAMPLES, SHIPPING UNITS | OPERATIONAL UNITS | USED UNITS (FAILED, RETURNED, REFURBISHED) |
| METRICS GATHERED 307 | COMPLETION TIMES VS. CYCLES TO FAILURE | FIRST-USE COMPLETION TIMES / COMPLETION TIMES VS. CYCLES TO FAILURE | COMPLETION TIMES VS. CURRENT CYCLE COUNTS | COMPLETION TIMES VS. CURRENT CYCLE COUNTS / COMPLETION TIMES VS. CYCLES TO FAILURE |
| TEST CONDI- TIONS 308 | CONTROLLER | CONTROLLED | UNCONTROLLED | CONTROLLED |

|         | PROGRAM 0 | PROGRAM 1 | PROGRAM 2 |
|---------|-----------|-----------|-----------|
| BLOCK 0 | 950       | 900       | 960       |
| BLOCK 1 | 1115      | 1050      | 1130      |
| BLOCK 2 | 750       | 700       | 760       |

|          | AVERAGE | C.I. (95%) |
|----------|---------|------------|
| BLOCK 0  | 936.67  | 36.38      |
| BLOCK 1  | 1098.33 | 48.12      |
| BLOCK 2  | 736.67  | 36.38      |
| BASELINE | 700     | 50         |

|          | AVERAGE WITH C.I | BASELINE DIFFERENCE |
|----------|------------------|---------------------|
| BLOCK 0  | 900.29           | 150.29              |
| BLOCK 1  | 1050.21          | 300.21              |
| BLOCK 2  | 700.29           | -49.71              |
| BASELINE | 750              | N/A                 |

|         | SPEC PE CYCLE | PE CYCLE ESTIMATION |
|---------|---------------|---------------------|
| BLOCK 0 | 10000         | 15000               |
| BLOCK 1 | 10000         | 20000               |
| BLOCK 2 | 10000         | 75000               |
| TOTAL   | 30000         | 42500               |

|  | INITIAL PGM TIME | PGM TIME 2500 CYCLES | PGM TIME 5000 CYCLES |
|---|---|---|---|
| BLOCK 0 | 700 | 685 | 660 |
| BLOCK 1 | 700 | 705 | 695 |
| BLOCK 2 | 700 | 650 | 600 |
| BASELINE | 700 | 675 | 650 |

|  | REMAINING LIFE (CYCLES) | REMAINING LIFE @ 2500 | REMAINING LIFE @ 5000 |
|---|---|---|---|
| BLOCK 0 | 10000 | 7500 | 5000 |
| BLOCK 1 | 10000 | 10000 | 7500 |
| BLOCK 2 | 10000 | 5000 | 2500 |
| BASELINE | 10000 | 7500 | 5000 |

*FIG. 6B*

ESTIMATING WEAR OF NON-VOLATILE, SOLID STATE MEMORY

SUMMARY

Various embodiments described herein are generally directed to methods, systems, and apparatuses that facilitate estimating wear of non-volatile, solid state memory. In one embodiment, a system, method, apparatus, and/or computer-readable medium facilitates life cycle management of a non-volatile, solid-state memory device by measuring completion times of data storage operations targeted to the memory device. Wear of the memory device is estimated using the measured completion times, and life cycle management operations are performed to affect subsequent wear of the memory device in accordance with the estimated wear.

In one arrangement, baseline completion times may be obtained for other equivalent memory devices. The baseline completion times result from applying a predetermined number of equivalent data storage operations to the other equivalent memory devices. The completion times are compared with the baseline completion times to estimate the wear of the memory device. In such a case, comparing the measured completion times with the baseline completion times may involve comparing an average and confidence interval associated with the completion times with a baseline average and baseline confidence interval associated with the baseline completion times.

In another arrangement, the data storage operations may include data programming operations targeted to the memory device. In another case, estimating wear of the memory device using the measured completion times may involve adjusting a wear metric using the measured completion times, wherein the wear metric includes at least a count of program-erase cycles. In yet another arrangement, measuring completion times may include measuring the completion times of the data storage operations targeted to a representative subset of memory units of the memory device. In such a case, the estimated wear is used to manage the life cycle of memory units of the memory device that are not in the subset.

In other arrangements, the life cycle management operations may include any combination of: wear leveling operations performed in accordance with the estimated wear; predicting an end of service life of the memory device in accordance with the estimated wear; and selecting new data for writing to the cells in accordance with the estimated wear and in accordance with characteristics of the new data that influence the wear of the memory device. In still other arrangements, comparing the completion times with the baseline completion times to estimate the wear of the memory device may include estimating wear based further on a context of the data storage operation. The context may include one or more of a programming voltage, a temperature of the memory device, and content of the data storage operations.

In another embodiment, a system, method, apparatus, and/or computer-readable medium facilitates access to a non-volatile, solid-state memory device by measuring completion times of programming operations targeted to units of a memory device. Wear metrics that include at least program-erase cycles applied to the targeted units are determined, and the wear metrics of the targeted memory units are adjusted using the measured completion times. A life cycle of the memory device is managed using the adjusted wear metrics.

In one arrangement, a centralized database is configured to gather, from an apparatus that measures the completion times and other apparatuses having equivalent non-volatile, solid-state memory devices, the completion times correlated with the wear metrics. An improved data model for estimating of wear is formed using the measured completion times in response to gathering the completion times correlated to the wear metrics. Data describing the improved data model is sent to the apparatus and the other apparatuses. The apparatus and the other apparatuses adjust the wear metrics of the targeted memory units using the measured completion times in accordance with the improved data model.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

FIG. 3 is a table of test scenarios according to an example embodiment;

FIGS. 5A-5D are tables that illustrate life-cycle predictions of memory devices according to example embodiments;

FIGS. 6A-6B are tables that illustrate life-cycle predictions of memory devices according to example embodiments;

DETAILED DESCRIPTION

Figure 1A:
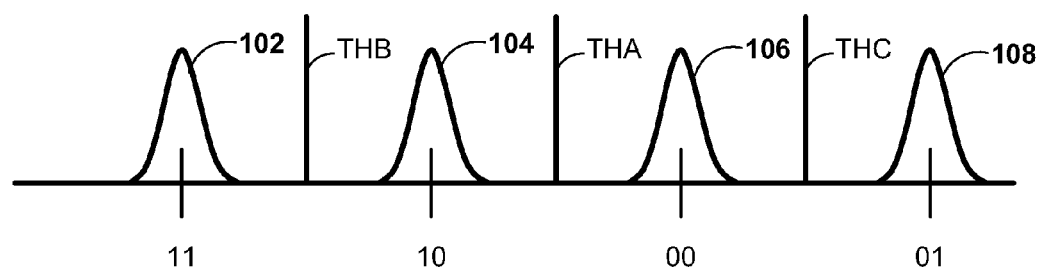
FIG. 1A is a block diagram illustrating voltage distributions and reference voltages of a multi level cell (MLC) memory device according to an example embodiment.

The present disclosure relates to techniques for estimating wear of a non-volatile, solid-state, data storage device. As will be described in greater detail below, wear levels of non-volatile, solid-state memory is often estimated based on the number of program-erase (PE) cycles applied to memory units. This wear metric can be supplemented or replaced by metrics derived from other performance characteristics, such as completion times for media storage/access (e.g., read/write/erase) operations. These alternate and/or adjusted wear metrics can be used to more effectively manage life-cycle of the memory devices.

General-purpose and special-purpose computing devices often utilize some form of non-volatile memory to retain system state and other data when power is removed. Hard drives have historically been the primary non-volatile storage devices for computing devices due to, e.g., a low price-per-unit of storage capacity. Solid-state, non-volatile memory storage devices have also been available for many years, but due to historically higher price-per-unit of storage, have often been relegated to special purpose uses, such as for basic input-output system (BIOS) image storage, removable/portable storage (thumb drives), etc. Even given a relatively high cost, solid-state media has been used as the primary and/or sole non-volatile data stores for some specialized devices, such as those with minimal storage needs (e.g., routers, embedded devices), and/or where the need for physical durability justifies the higher cost (e.g., ruggedized military computers).

As the prices of non-volatile solid-state media have fallen in recent years, this type of media has also become a viable alternative to hard drives for use in enterprise and consumer-grade general-purpose computers. For example, a number of manufacturers now produce solid-state drives (SSD) that serve as plug-in replacements for traditional, magnetic media, hard drives. The SSD generally includes a standard hard-drive data interface (e.g., SCSI, SATA) and a physical form factor that allows the device to be easily mounted in place of a hard drive. The SSD, while currently still more expensive per unit of storage than a traditional hard drive, offers many advantages over hard drives, including faster access times, lower power consumption, and greater physical durability.

One limiting factor in performance of solid-state memory is the endurance of the storage media. While solid-state memory is physically durable (e.g., highly resistant to effects of shock and vibration), the cells are known to have a finite electrical life. That is, a cell may be written and erased a finite number of times after which the structure of the cell may become physically compromised and can no longer reliably store data. This effect can be more pronounced in some types of storage media than others.

One commonly used non-volatile solid-state storage media is flash memory. Flash memory, e.g., NAND or NOR flash memory, includes cells similar to a metal-oxide semiconductor (MOS) field-effect transistor (FET), e.g., having a gate (control gate), a drain, and a source. In addition, the cell includes what is known as a "floating gate." When a selected voltage is applied to the floating gate, differing values of current may flow through the gate depending on the value of the threshold voltage. This current flow can be used to characterize two or more states of the cell that represent data stored in the cell.

The number of electrons on the floating gate determines a threshold voltage level of the cell and does not change significantly upon removal of power to the cell. This characteristic of the floating gate facilitates persistent storage of the data in the cell. The threshold voltage of the floating gate can be changed by applying an elevated voltage to the control gate, thereby changing data stored in the cell. A relatively high reverse voltage can be applied to the control gate to return the cell to an initial, "erased" state.

Flash memory may be broken into two categories: single-level cell (SLC) and multi-level cell (MLC). In SLC flash memory, two voltage levels are used to characterize a state of each cell, thus allowing SLC flash memory to store one bit of information per cell. In MLC flash memory, more than two voltage levels are used to characterize a state of each cell, thus allowing MLC flash memory to store more than one bit per cell. Although MLC flash memory is capable of storing more bits per cell than SLC flash memory, MLC flash memory often suffers more from degradation/wear due to repeated use than does SLC flash memory.

This type of wear may be a limiting factor to the performance of devices such as SSDs, which may make extensive use of MLC flash memory. For example, some SSDs may artificially throttle the write performance to a lower level to ensure a guaranteed life-span. Because the wear is relatively predictable, the SSD may monitor wear. This monitoring can be for informational purposes, e.g., to inform the user of expected endurance and/or conditions which may impact performance. Wear monitoring can also be used to modify devices operations that affect subsequent wear, e.g., evenly distribute wear among all memory units.

Some systems track usage statistics of flash media in order to estimate wear. This can be used to inform the user about wear (and other lifecycle information) so that actions such as preventative maintenance can be performed. For SSDs and similar devices, a fairly simple measure of endurance/wear is a count of the number of program-erase (PE) cycles applied to particular memory units. This can be tracked, e.g., by incrementing a counter for each PE cycle applied to each memory block/unit. In other situations, atomic operations (e.g., write-verify operations) within each PE cycle may also be tracked. These values may be compared to limits determined by the flash manufacturer (e.g., based on preproduction testing of a particular die design) in order to estimate a current state of wear and/or estimate remaining life of the media.

Generally, published endurance numbers derived from preproduction testing may be purposely conservative to ensure that a wide range of variation within the vendor product supply will fall above that endurance value. However, by making an overly conservative estimate of endurance, the end-product designer may be end up throttling read/write performance of their memory devices more than is necessary. This may limit the performance of the memory device that might otherwise be enjoyed by customers if the throttling did not occur. Thus, as will be described in greater detail below, by obtaining more accurate wear information, lifecycle management operations that affect subsequent wear can be adjusted accordingly in order to improve device performance.

As previously mentioned, flash memory retains state by charging a floating gate to a particular voltage. This results in a predefined amount of current flowing through the gate when a specified threshold read voltage is applied. This can be seen in FIG. 1, which illustrates voltage distributions for an MLC memory array capable of storing two bits per memory cell according to an example embodiment. Generally, when a flash cell is read, a voltage intermediate between the voltages THB, THA, and THC is applied to the control gate of the cell. The MOSFET channel will become conducting or remain insulating, depending on the applied voltage, which is in turn controlled by charge on the floating gate. This threshold voltage, or read voltage, determines what data is currently stored in the cell.

In the example of FIG. 1A, the digital symbol '11' corresponds to the lowest read voltage distribution 102, and may represent the erased state. Voltage distribution 104 is associated with digital symbol '10', voltage distribution 106 is associated with the digital symbol '00', and voltage distribution 108 is associated with the digital symbol '01'. For each digital symbol, the digit on the left is the most significant bit (MSB) and the digit on the right is the least significant bit (LSB). It will be appreciated that the illustrated MLC voltage distributions in FIG. 1A are provided for purposes of illustration, and the concepts described herein may be equally applicable to other types of non-volatile, solid-state memory cells, including those with fewer or greater bits of data per cell.

In order to write/program a solid-state memory cell (assuming that the cell is in a state ready for programming, e.g., erased), controller circuitry applies a voltage to the control gate of the cells until the floating gate is charged to the desired threshold voltage associated with the data being written. The time it takes for this operation to complete may vary depend on a number of factors. For example, operations that require higher activation energy to move electrons into the floating gate may take a longer time to complete.

Figure 1B:
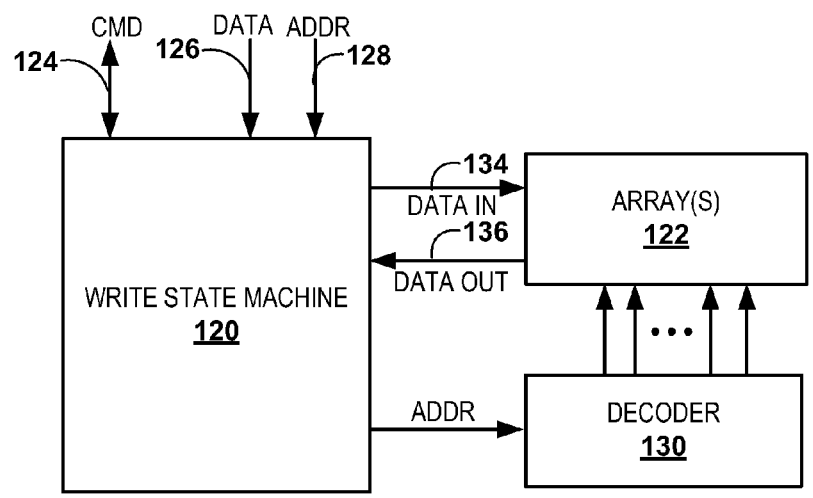
FIG. 1B is a block diagram of a write state machine and associated circuitry according to an example embodiment.

In reference to FIG. 1B, a simplified block diagram of solid state write circuitry illustrates an example of how writes to non-volatile solid state memory may be performed in some devices, and why completion times for these operations may vary. In this example, a write state machine 120 may act as an intermediary between a controller (e.g., controller 904 shown in FIG. 9) and the storage media, here represented as memory arrays 122. The controller may issue write commands via path 124 with accompanying data and target addresses via paths 126, 128. The write state machine 120 may select, via decoder 130, the targeted memory cell(s) within arrays 122 and cause the programming voltage to be applied to the targeted cells via path 134.

In order to ensure the cell being written to exhibits the desired threshold voltage (e.g., as seen in FIG. 1A), the write state machine 120 may perform a read of the targeted cell via line 136 following the write to verify what threshold voltage is exhibited by the cell. In order to prevent overshooting the desired threshold voltage, the write state machine 120 may perform a repeated sequence of these write-verify cycles, after which a signal indicating success or failure (e.g., after some predetermined number of attempts) may be returned to the controller. Thus the actual time needed to complete the write operation may depend on the number of these write-verify cycles that needed to set the threshold voltages to a desired level.

A number of factors may affect write completion times. Depending on the particular design of the write state machine 120 and the arrays 122, it may take a greater amount of time to program a cell based on the content of the data to be programmed. For example, a transition from values of '11' to '01' as seen in FIG. 1A may take longer compared to a transition from '11' to '10' due to a greater voltage difference between the starting and final state of the floating gate in the former case compared to the latter. As previously noted, other factors may influence this time, including wear of the cell, temperature of the cell, manufacturing variations, voltages applied during programming, etc. These factors may also affect completion time of other data storage operations, including reads and erasures of the memory cells.

One factor of interest here that affects completion times is the wear of the cell, e.g., the number of times voltages have been applied to the cell for purposes of programming, reading, erasure, etc. The system designer may need to take this variability into account when designing the write state machine 120 and other components. This variability may also provide a useful indication as to a current state of wear. This type of wear indication may be specific to a particular memory unit, and may be independent of conservative estimates of wear based on factors such as a range of PE cycles that are found to induce failure in preproduction units.

The term "wear" as used herein may refer generally to any degradation of solid-state memory cell performance caused by use. A number of different criteria may be used to determine/define whether a memory cell is worn out. For example, one measure of endurance for solid state memory cells is known as retention time. After a memory cell has been programmed, it may sit idle for a long period of time, e.g., months or years. As the cell sits idle, it begins to lose electrons off the floating gate. If this loss is significant, a subsequent reading of data from the cell may be erroneous. Generally, the stronger the insulating layer within cell layers the fewer electrons that will be lost, and therefore the longer the retention time. In another example, a non-volatile memory cell may be considered to be worn out if it cannot reliably retain data for a specified period of time and/or be correctable with a specified amount of error correction coding (ECC) or other compensations. This type of wear may be determined by an attempt to read the cell after the passage of time, and may or may not depend on whether the data is recoverable via ECC.

Other factors besides passage of time may negatively affect electrons that are stored in the floating gate. One of these factors is generally referred to as a "disturb" effect. Disturb effects occur when the charge stored on the floating gate of a transistor memory cell is disturbed unintentionally by local electrical signals present when other memory cells (e.g., physically proximate cells) are erased, programmed, and/or read. These phenomena are respectively referred to herein as erase disturb, program disturb, and read disturb, respectively, and are referred to collectively as disturb effects. Disturb effects may be dependent on the way the memory cells are connected and/or physically arranged. Generally disturb effects are thought to arise because electrical signals used to read, program, and/or erase memory cells are applied to some extent to memory cells in the circuit that are not being read, programmed or erased. Analogous to a cell's retention time versus the state of its insulating layer, cells with stronger insulating layers may be more resistant to disturb effects.

A solid-state memory cell may also be considered to be worn out when it takes too long to program or fails altogether to program. This type of failure may be caused from a cell insulating material that is so electrically deteriorated that it cannot hold a charge anymore. This mode of failure may sometimes be seen suddenly and early in the lifetime of the product (e.g., due to a defect on the memory die), and if so, may be excluded for purposes of wear prediction. However, minor, random, and/or infrequent failures of this type might also be indicative of wear.

Certain performance characteristics and metrics related to wear (directly or indirectly) may be known/defined for a particular memory product. These characteristics/metrics may include minimal retention time, allowable amount of ECC, maximum number of PE cycles, disturb effects, programming voltages, data being written, operating temperatures, etc. These values may either be a direct indicator of wear and/or be combined with other values to adjust a wear estimate. For example, device temperature and/or composition of the data being written during particular PE cycles may be used to adjust a wear estimate upwards or downwards. These values may be based on any combination of vendor information, lab measurements, and results gathered from deployed systems in which the products are used. These characteristics may vary over time for different generations of the same product due to factors such as better measurements, improvements in the design and/or manufacturing processes, operating parameters of a particular target application/user, end-of-life analysis of fielded devices, etc.

It is advantageous to be able to more accurately predict a current state of wear of a non-volatile, solid-state memory device. Such wear estimations may be used for purposes such as predicting an end of life of a non-volatile product and/or better managing the use of such products while still in service. An example of the latter includes performing life cycle management operations to affect subsequent wear of the memory device in accordance with the estimated wear. These life cycle operations may include wear leveling, in which the device controller attempts to select pages for writing based on an amount of wear associated with those pages. Wear leveling algorithms generally attempt to ensure that operations that cause memory cells to wear (e.g., erasure and programming) are evenly distributed among the entire population of memory cells so as to prevent, for example, any subset of the cells from failing significantly earlier than the other cells.

Another life cycle operation that affects subsequent wear may include selection of particular data for storage in cells based on estimated wear. For example, some data may include large portions that require little or no change of cell state to store, e.g., an erased cell's state remaining unchanged or transition to proximate state such as shown in FIG. 1A. In such a case, storage of such data, while still possibly incrementing a count of a PE-cycle-based wear metric, may cause less actual wear on the memory units than would storage of other data. Thus, new data may be selected for writing to particular memory units in accordance with the estimated wear (e.g., based on completion times of access operations) and further in accordance with characteristics of the new data that influence the wear of the memory device. If this type of data selection is repeatedly applied, then the cells that show excessive wear based on access completion times may subsequently experience a slower rate of actual wear, and at some point exhibit access operation time measurements that more closely correspond to the other wear metrics such as PE cycles.

Embodiments described herein may include features for at least measuring completion times of memory cell data storage operations, and predict/modify wear metrics based on the completion times. Such embodiments may facilitate, for example, measuring variations in program, erasure, and/or read times over the usage life of a product to predict wear and retention characteristics of the product. Although these embodiments may be described in the context of particular memory technologies (e.g., NAND flash memory) these concepts can be generalized for other storage media which exhibit similar behaviors in response to usage/wear.

In reference again to FIG. 1B, the write state machine 120 may include facilities (e.g., a local/external register, communications interface) for recording statistics related to individual memory cells or groups of cells. These statistics may be used, alone or in combination, to predict wear. For example, the write state machine 120 may record/increment a count of PE cycles, write-verify cycles, reads, voltages applied, and other factors related to access of the memory arrays 122. It should also be noted that the metrics described are exemplary, and may not be the only metrics that are measurable for the purposes of predicting, estimating, or adjusting wear values.

The write state machine 120 may further include facilities that allow elapsed time of these various operations to be recorded. For example, by way of communications via command line 124, the completion times of particular data storage operations may be determined by a controller or other circuitry that manages device operations. In another example, if write-verify cycles generally occur over a fixed period of time, then a count of write-verify cycles (along with other factors, such as clock speed) may be used to estimate elapsed time for operations such as programming and erasures. In yet another variation, the write state machine 120 (or associated circuitry) may include the ability to directly measure completion times of these types of operations and communicate the measurements to other parts of the system (e.g., via a command bus or memory register). These measurements may be in the form of a count of clock cycles or other units of measure (e.g., microseconds, nanoseconds).

The various embodiments described herein may use measured/estimated completion times of data storage operations to make predictions about the wear (e.g., remaining life), estimation of current wear, and provide feedback on any of these values. Other aspects of these collective measurements may also be used to manage wear, such as the variation over time for equivalent operations, current conditions/context of the operations, variation between individual memory storage units, etc. These aspects may be derived using known statistical analyses, some of which will be described in greater detail hereinbelow.

Figure 2:
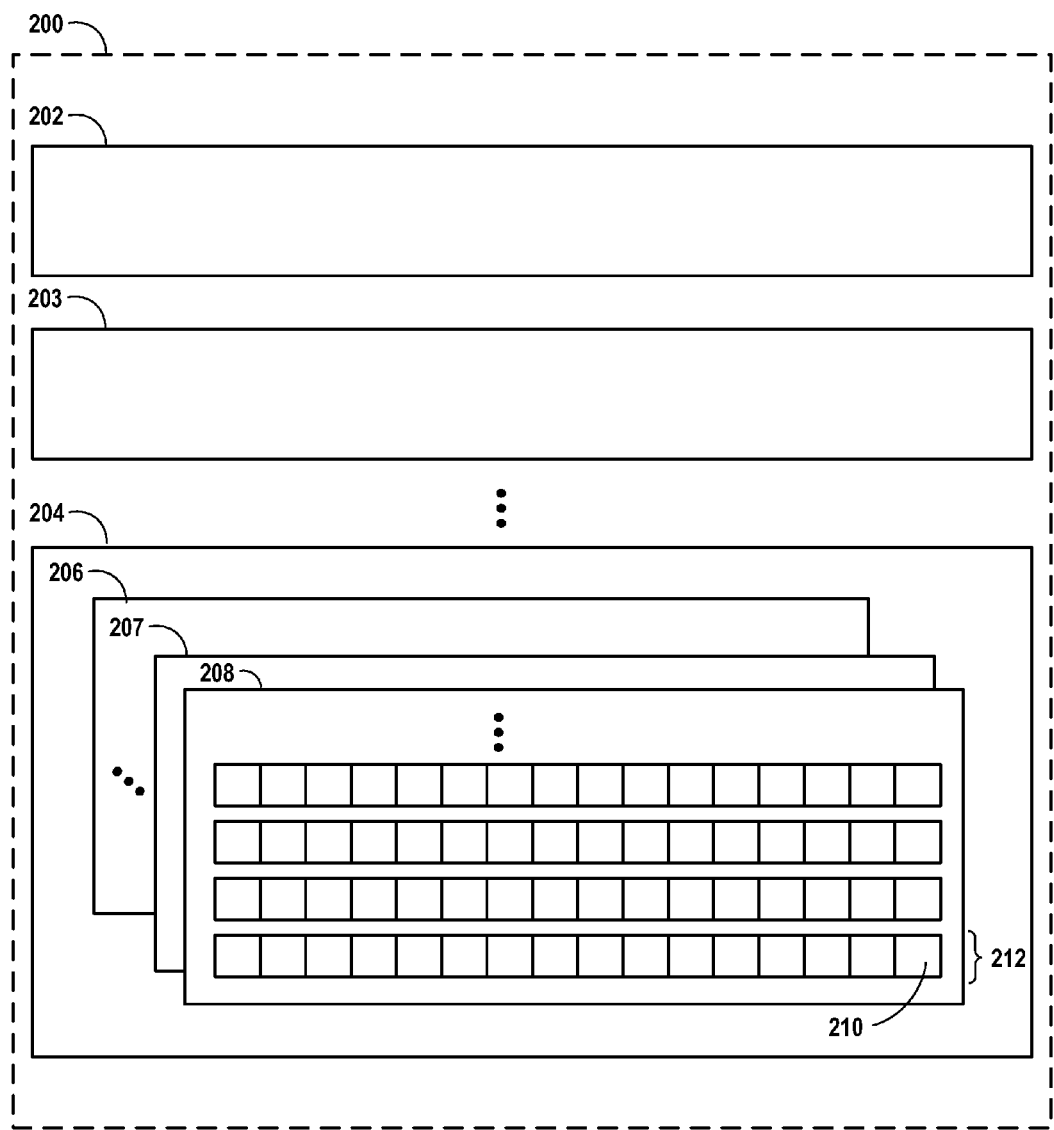
FIG. 2 is a block diagram illustrating different populations for measurement according to an example embodiment.

For the purposes of this disclosure it should be noted that a sample/subset of memory devices may be analyzed/measured to speed up and simplify the implementation for an entire population of equivalent devices. This is shown by way of a block diagram in FIG. 2. The block diagram identifies a population 200 of non-volatile, solid-state memory devices that may be collectively analyzed for purposes of failure prediction as described herein. At a high level, the population 200 may include a number of manufactured devices (represented by blocks 202-204) suitable for sale, either individually or by lot. Examples of these devices 202-204 include SSDs, portable storage devices (e.g., thumb drives), mobile computing devices, media players, controller boards, expansion boards, system on a chip (SoC), etc.

Generally, the devices 202-204 may be related based on an associated population of non-volatile, solid-state memory components (e.g., components 206-208) included within the devices 202-204. These memory components 206-208 may include memory chips and memory dies, for example. Generally, the memory components 206-208 may be related/equivalent within the population 200 based on any combination of vendor/manufacturer, manufacturing facility/foundry, model number number, part number, lot number, etc. The intention is that statistical averages across the population 200 are relevant/meaningful as applied to the individual memory components 206-208 and their respective subcomponents.

The memory components 206-208 may be further individually characterized at a granularity which can extend to individual cells (e.g., cell 210). More commonly, cells are accessed at the granularity known as a page, such as page 212. The page 212 is generally the smallest individually addressable memory unit in this type of memory device, and includes a plurality of memory cells that are accessed together in a single operation. Some non-volatile, solid-state memory devices may be arranged such that a page may include cells from different dies/planes, e.g., to enable increase data throughput through parallel access operations.

The memory devices 206-208 may include other partitions that are larger than an individual page 212. For example, the devices 206-208 may be logical partitions that identify groups of pages to be operated on together for purposes such as erasure, garbage collection, etc. The number of devices, components, and/or partitions in the population 200 can range from a single cell or addressable element to all devices 202-204 in the population 200 and any value in-between. The various example embodiments shown herein are not meant to be limiting on the composition or number of these groups. Generally, any of these partitions of physical and logical structures within the population 200 can be used, either alone or in combination, for units for purposes of wear estimation. Data collection can be gathered at the granularity of these wear estimation units, and life cycle management can also be applied at this or some other unit level.

In one arrangement, completion times for particular data storage operations may be gathered for every page 212 of a larger block 208 (e.g., an erasure block), or only a sample of pages 212. In either case, these page measurements may be combined to create a composite wear metric for managing lifecycle events of the erasure block 208 as a whole. For example, an average write completion time for an erasure block could be an average completion time of all pages from an erasure block, or could be any representative selection of the program completion times within the erasure block. When certain life-cycle events are applied (e.g., wear leveling, retiring an erasure block from further use, moving/refreshing data to account for data retention limits), they could be applied at the block level based on these averaged/compiled values.

It may be useful to establish a baseline set of metrics for a particular population 200 of devices. In reference now to FIG. 3, a table 300 illustrates various phases when these metrics can be gathered. Rows 302-305 indicate a particular life-cycle phase of a population of devices. The rows 306-308 generally indicate examples of devices tested (e.g., to gather metrics for use by the entire populations), metrics gathered, and an amount of control over the test conditions, respectively The pre-production phase 302 may include any time from when the production prototypes are created up until the full production line for shipping items is in operation. The devices tested at this phase 302 may include prototypes and test units, and as a result testing to induce failure may be performed on these devices under controlled conditions (e.g., temperature, data written, etc.).

The manufacturing phase 303 is generally when shipping products are being assembled and tested. This phase 303 may also include full or sample testing, e.g., burn-in, self-test, etc. As a result, the testing may include tests which induce minimal wear, such as performing a small number of data storage operations as part of a power on self test or burn-in. For testing of production samples, more vigorous, longer-term reliability tests may be performed, e.g., may induce end-of-life type failures. These tests may also be conducted under controlled conditions.

The in-use phase 304 may include a period when operational units are in the hands of end users. If it is possible to gather metrics during this phase, it may include data related to completion times of data storage operations versus cycle counts. The conditions of these tests may be outside of control of the entity gathering the metrics. This type of data gathering may provide a more real-world measure of how wear metrics of the non-volatile, solid-state memory compare. As a result, data gathering in phase 304 may also involve tracking other conditions (e.g., operating temperatures) outside the control of the testing organization to determine if these other conditions are causing outlier behavior or otherwise skewing results. It should also be considered that at stage 304, certain user actions may affect the devices that were not contemplated by the designer or manufacturer, such as custom modifications, new uses for a known type of device, etc.

The post mortem phase 305 may be performed on devices that are obtained after some period of use. This phase 305 does not always imply a failure of the device or non-volatile, solid-state memory of the device, but may include devices that would not normally be returned to service without some other action (e.g., repair, refurbishment). As with the in-user phase 305, devices examined in the post mortem phase 305 may include valuable information about real-world performance, albeit possibly being more difficult to identify conditions that might have caused unexpected results, e.g., wear symptoms that are higher or lower than expected based on some metric like PE cycles.

During at least the manufacturing phase 303 (and/or early life testing 302), all memory devices (or a representative sample) may be tested using some sort of program testing. This testing generally includes sample sizes large enough to give a statistically significant result upon which to base predictions for the whole population. The timing measurements for each device may be kept for each round of cycling. In order to predict the variation in the PE cycle limits for the memory device, it is possible for data storage completion times of memory components within the population to be compared to equivalent times of a representative sampling of devices, hereafter referred to as "baseline completion time." These times may include completion times of any combination of data storage operations, including reads, writes, and erases.

One advantage of using test data gathered during early phases 302, 303 is that this data can be stored on the devices during manufacturing, e.g., when writing configurations and/or firmware images to the shipping device. These configurations may vary over time based on certain conditions, e.g., changes in current vendor and part number of non-volatile, solid-state memory components being installed in manufactured devices. These changes can be applied to currently shipping devices, and may also be updated/applied to in-service devices as explained in greater details below. By adding the data to the device at least during manufacture, the manufacturer can optimize the life-cycle management algorithms using the most up-to-date available data at the time the device leaves the factory.

In some embodiments discussed herein, a prediction of effective life of non-volatile, solid-state memory may be desired based on a current measure of read/write/erase completion times. This is shown in graph 400 of FIG. 4A. In this graph, the vertical axis 401 represents a metric (e.g., PE cycles) used to estimate wear of a memory device, and the horizontal axis 402 represents the time to complete a data storage operation as described herein. Horizontal lines 403, 404 represent two milestone points in the life of the device. For example, line 403 may represent the state of a brand new device, and line 404 may represent a point at which the device may be considered as "worn out" according to criteria discussed herein.

As has been described elsewhere herein, the completion times for access operations (e.g., programming operations) is known to decrease as wear increases. This is represented on the graph via specification wear line/curve 406. This curve 406 may represent a conservative estimate of device performance over the device's whole life, such as might be published in manufacturer specifications. For example, if it a device has a specified life of 10,000 PE-cycles, milestone 403 may represent a brand new device (zero PE cycles), and milestone 404 may represent the end of useful life of the device per the published specifications (10,000 PE-cycles). Vertical line 405 indicates a wear limit that is independent of any count of PE cycles or the like, such as a measured completion time of a data storage operation.

Measured performance of actual, in-service devices is represented by curves/lines 407-409 in graph 400. In all of these cases, it is assumed that if completion time 405 is measured for a current data storage operation, then the device is effectively at its end of life, regardless of other metrics (e.g., number of actual PE cycles the device has been subjected to). It should be noted that the shapes and relative scales of the lines/curves 406-409 are presented for purposes of explanation and illustration, and do not necessarily represent realistic or actual measurements.

Generally, curves 407-409 illustrate different ways in which a device's actual performance may vary from the theoretical, specified performance 406. Line 407 represents a case where the completion time at the brand new milestone 403 is above specification, and further the slope of the line 407 is roughly equivalent to the specified value 406. From this, two things can be inferred about a device to which measurements 407 apply. First, the device can be predicted to have longer life than specified, which can be seen by the portion of line 407 that extends above the specified end-of-life count 404. Further, this amount of extra life can be predicted early in the life of the device, e.g., by extrapolating from the point where line 407 intersects line 403.

Similar to line 407, line 408 is roughly parallel to specified curve 406, and so the end of life of the associated device can be predicted from earlier measurements. In this case, however, the device associated with curve 408 exhibits a shorter life in terms of wear cycles than specified due to faster completion times than the specification curve 406. Finally, curve 409 illustrates a case where the new device performs quite close to the specified curve 406 early in the life of the device, but improves later on, as seen by portion of curve 409 extending above line 404 by the time completion time 405 is measure. In the case represented by curve 409, early measurements of access completion times may not be indicative of end of life performance, although it may resemble the expected/specified behavior 406 over at least some portion of the product life.

In some embodiments discussed herein, measurements may be made at various milestones to estimate current wear, e.g., for use by processes such as wear leveling and data retention algorithms. A measurement of completion times measured at one milestone, e.g., 403, may be used to predict another milestone, such as effective end of life of the product, current amount of wear (% worn), etc. These lifecycle predictions may be continually updated through other milestones during the life of the product, such as to account for cases such as 409.

The lifecycle prediction data discussed herein may be presented as a histogram of certain test values. For example, completion times of known and/or random read/write/erase operations to non-volatile, solid-state memory can be initiated for a sample set of devices and completion times measured and statistically combined. This sampling can be any combination of lab-tested devices, the manufactured prototypes undergoing usability/reliability testing, fielded devices, and devices that are out of service. An example of these measurements according to an example embodiment are shown as histograms 420 and 421 in FIG. 4B.

Each of histograms 420, 421 reflects a distribution of data storage operation completion times for a particular device that has been subjected to a known number of PE cycles (or other measure of wear). For example, histogram 420 may represent a distribution of measurements of programming times when the device has been subjected to no more than 100 PE cycles, and histogram 421 may represent the same when the device has been subjected to 5000±50 PE cycles. These measurements 420, 421 may be multiple equivalent measurements made to a particular device/address, and/or may be combinations of measurements made to similarly worn subelements of a larger block. In the latter case, the histograms 420, 421 may be used to characterize the entire block, even if all units are not tested, or even if all units are not at a similar level of estimated wear cycles. For example, the histograms 420, 421 may represent the most worn portions of the blocks.

Overlaid with the histograms 420, 421 are theoretical (e.g., Gaussian) distributions 422, 423 that represent the specification completion times for the device at these same milestones. Particular points within both the histograms 420, 421 and distributions 422, 423 may be selected for comparison with each other to determine, e.g., if the measured values 420, 421 indicate more or less wear that those values 422, 423 defined in the specification. In the distributions 422, 423, these comparison points are indicated as completion times 424, 425. Completion times 424, 425 may be selected where X % of the blocks exhibit a completion time that is less than a selected value. An example of X would be 5% based on confidence intervals of manufacturing estimates, e.g., published in memory device specifications of the vendor. This same measurement and selection methods could be applied to internally conducted lab tests, and/or based on a running average of manufactured and fielded devices using the same or similar measurement criteria.

Once the standard completion times 424, 425 have been established, it is then possible for an operational device to compare the actual program completion times 420, 421 to the baseline completion times 412-415. These comparisons may also utilize a confidence interval of the measurements 421, 420, as represented by values 426, 427. These values 426, 428 may be obtained as known in the art, e.g., assuming a particular distribution (e.g., Gaussian) of the data 420, 421 and applying a formula appropriate to that distribution. To ensure estimate of wear is still conservative, the lower limit of measurements 420, 421 may be used, e.g., values 426 and 427 are selected such that Y % of the measurements 420, 421 exhibit a completion time higher than selected values 426, 427.

Figure 4A:
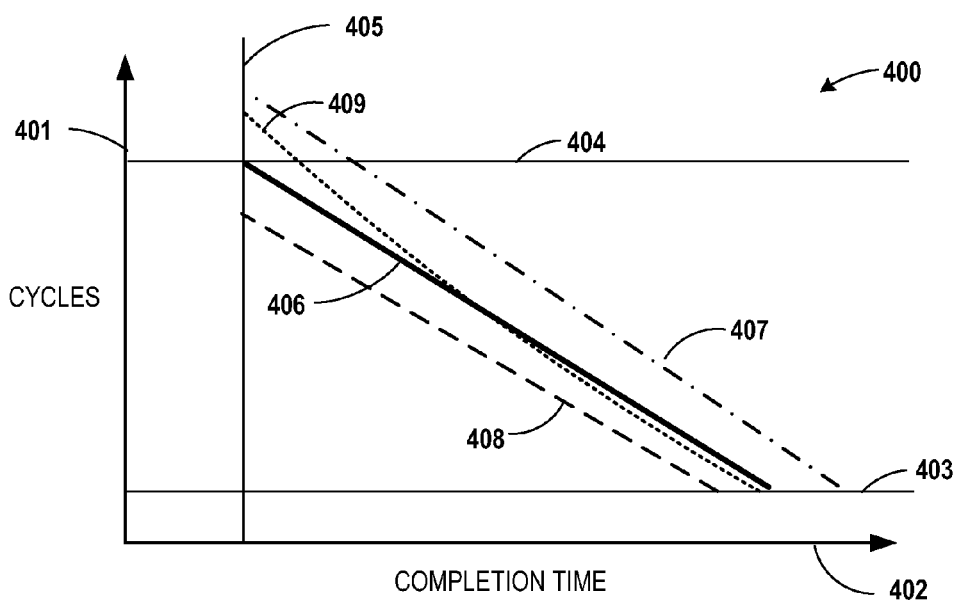
FIG. 4A is a graph of wear profiles according to example embodiments.
Figure 4B:
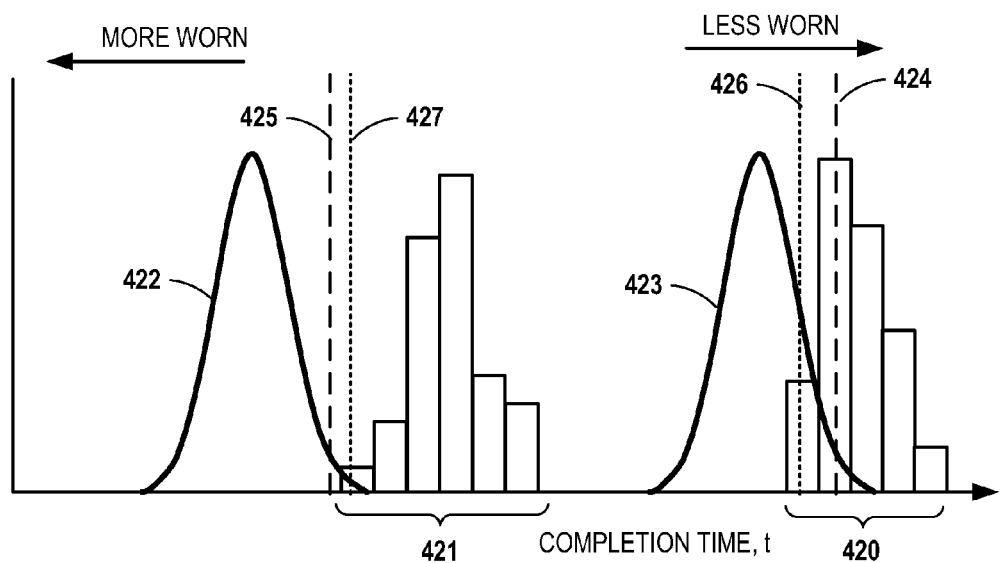
FIG. 4B is a graph comparing histograms and baseline distributions according to example embodiments.

As can be seen in FIG. 4B, this conservative estimation still predicts a higher completion time (thus less wear) when comparing measured completion time 427 to theoretical/specified completion time 425. However, the completion time 426 indicates greater wear than compared to the baseline limit time 424, even though a comparison of the histogram 420 as a whole with distribution 423 would suggest otherwise. In order to ensure that a conservative estimation of wear based on completion times does not negatively affect devices that are performing at or only slightly better than spec, a ceiling/floor/step function may be applied such that wear is not adjusted upwards (or life expectancy adjusted downwards) unless the average of distribution 420 is less than the average of the baseline distribution 423.

The comparisons of data storage completion times can be used as a measure of wear in and of itself (e.g., 30% worn) or be used to augment/adjust/predict another metric associated with wear, such as PE cycles. The latter metric may be more commonly used in the industry, e.g., represented in the specifications provided by memory vendors as a measure of endurance. In such a case, expressing predicted and/or adjusted wear in terms of an industry standard such as PE cycles (or the like) may be of use in comparisons between different products.

An adjusted endurance metric for each measured device may be derived as shown in Equation 1 below, where Cycles$_{adj}$ and Cycles$_{spec}$ indicate respective adjusted and specified wear cycle counts (e.g., PE cycles), t$_{curr}$ and t$_{base}$ represent respective currently measured and baseline completion times, and k$_i$ represents a scaling factor. Generally, Cycles$_{spec}$ is an estimate of product life that may be provided by a manufacturer or the like, and may be a highly conservative estimate derived early in the product development cycle. The Cycles$_{adj}$ represents a predicted endurance of a particular instance of that product. The completion times t$_{curr}$ and t$_{base}$ are based on a same/similar milestone in the life of the product, e.g., a particular range of current PE cycles. The t$_{curr}$ is currently measured on the particular device, and t$_{base}$ may be derived from published specifications. It should be noted that k$_1$ may be constant or variable, e.g., dependent on current conditions such as temperature, data being written/read, current number of cycles already on the device, etc.

$$\text{Cycles}_{adj} = \text{Cycles}_{spec} + k_1 \times (t_{curr} - t_{base}) \qquad [1]$$

During the runtime operation of the device (e.g., after manufacturing) the system may monitor the completion times of data storage operations performed on non-volatile, solid-state memory of the device. For example, during the normal operation of flash devices, the program times get faster as the device wears out. This may be caused by the degradation of the insulating material, which makes it is easier for electrons to move into (and out of) the floating gate, thereby allowing the program operations to complete faster.

A system may monitor the variation of program times for each flash device and use a function to predict wear and retention characteristics based on the variation. The system may store and compare the variation for each flash device individually or group them into sample segments. As the device ages over time the program time is expected to decrease due to degradation of the cell insulation layers. This degradation may be used as a metric for predicting the wear on the flash cell and further used to predict retention characteristics and other performance measures of the memory cells. This prediction of wear is represented below by Equation 2.

$$\text{Wear}_n = m \times (k_1 \times t_{curr}^{n1} + k_2 \times t_{avg}^{n2}) + (1-m)\text{Wear}_{n-1} \quad [2]$$

Generally, Equation 2 allows for selecting a number of weights for predicting current wear ($\text{Wear}_n$) based on previous wear estimates ($\text{Wear}_{n-1}$), current completion times ($t_{curr}$), and average completion times, e.g., of nearby or equivalent memory units ($t_{avg}$). Weighting value m, for example, may be selected with a value between 0 and 1. A value of m=0 discards any current completion time measurements in favor of previous measurements, and a value of m=1 discards previous wear measurements and calculates wear solely on current time measurements. The previous wear estimates $\text{Wear}_{n-1}$ may be based on completion times and/or other metrics such as PE cycles. Other weighting values k1, k2, n1, and n2 may be selected to balance current memory unit completion time behavior with other observed behavior, e.g., behavior of other memory units that may be used to collectively characterize a larger block of data. This can be used to limit the outlier effects of a particular cell or group of cells when characterizing larger blocks, thereby preventing overreaction by processes that rely on the estimated wear data.

An example of how estimated wear may be derived and used according to an example embodiment is shown by way of tables illustrated in FIGS. 5A-5D. The numbers and calculations used in the examples of FIGS. 5A-5D are for purposes of illustration, and not intended to be limited to the particular types of measurements taken and/or calculations used. In this example, it is assumed the baseline program time of a device at a current lifecycle milestone (e.g., newly manufactured device) is 700±50 μs (95% confidence). The specified PE cycle limit of the device is 10,000 cycles. A manufacturing test process is performed on the device, the results of which are shown in table 500 of FIG. 5A. In this test process, three measurements of programming time are made during this milestone on three different memory blocks of the device. From the measurements of table 500, averages and confidence intervals may be calculated as shown in table 510 of FIG. 5B. Also seen in the last row of table 510 is the baseline average and confidence interval of the product specification noted above.

In table 520 of FIG. 5C, a single value of completion time is obtained for both the measured and specified values using the averages and confidence intervals of table 510. To obtain a conservative estimate, the respective confidence intervals are added to the average specification baseline program time (last row of table 520) and subtracted from the measure times (first three rows of table 520). As previously discussed (e.g., in relation to FIG. 4B), this conservatively estimates the wear based on measured completion times compared to wear based on values in the specifications.

It should be noted that the application of confidence intervals shown in table 520 is for purposes of example, and any combination of confidence intervals and averages may be used, including a straight comparison of averages without consideration of confidence intervals. It will be appreciated that in the early stages of implementation, calculations that are at least somewhat conservative may be preferable (e.g., respective addition and subtraction of 50% confidence intervals), and a more aggressive application of the completion times to predict wear may be used as this technique becomes more proven. Another option is to apply floor and/or ceiling functions to avoid predicting lower-than-specified life for a device that is currently operating at or near spec, while allowing increased life estimation for devices that are performing much better than spec.

The rightmost column in table 520 shows conservatively estimated differences from baseline completion times for each block. These estimates can now be used to predict the PE cycles for each block, as seen in table 530 of FIG. 5D. The estimates shown in table 530 have changed the prediction value for all of the tested blocks, giving an additional 12,500 PE cycles to work with for endurance calculations. This may be used to minimize unneeded wear reductions actions (e.g., throttling) and may directly translate into increased performance experienced by the end user. For example, if it were assumed the memory Blocks 0-2 each have 8 MB of capacity, this 12,500 additional PE cycles may translate to as much as an additional 100 GB of data that can be written. If this were averaged across an entire drive of 512 GB with 64K blocks, this would result in an additional 6.8 PB of data written. Over a five-year warranty time, this could result in an additional 40 MB/sec of sustained throttled write performance.

In reference now to FIGS. 6A-6B, tables 600 and 610 illustrate an example of using access completion times (e.g., programming times) for predicting wear/retention according to an example embodiment. In this example, a non-volatile, solid-state memory device is endurance rated for 10,000 PE cycles with an initial average program time of 700±10 μs (95% confidence). During runtime, the program time of the memory device is measured at specific milestones, e.g., initial use, and then after 2500 and 5000 PE cycles have been applied to Blocks 0-2.

An estimation function may be applied to the measured times at each of the milestones, and remaining life can be estimated for each device. If the program times in the first three rows of table 600 deviate from the baseline times in the last row, the estimate of wear on the cell is proportionally adjusted to deviate from the specification value. These comparisons can be a normalized difference from baseline program time measurements in the lab, or based on any other population baseline estimations described herein.

In table 610, the predicted life in PE cycles is shown for each time interval based on the predictions at each milestone. As can be seen in the first row of table 600, the programming times of Block 0 are statistically close to the baseline values in the fourth row of table 600. Therefore Block 0 is predicted to wear according to spec, as seen by comparing the first and fourth rows of table 610. Block 1 has shown better than predicted results, so greater life is predicted for that device. Block 2 has shown worse than predicted results, so less remaining life is predicted for that device. These predictions may be adjusted over time based on current measurements. For example, the initial prediction for Block 2 was incorrect, as later measurements at 2500 and 5000 PE cycles shown this device exhibiting lower program time than baseline (thus greater wear). These types of correction, if statistically significant, can be fed back into the manufacturing process to make initial (and subsequent) prediction more accurate.

To further improve predication accuracy, a system can be implemented to provide closed-loop feedback from fielded devices of completion time measurements versus PE cycles and the like. This can result in higher confidence ratings, thereby facilitating more accurate predictions on wear. With more accurate, recalculated wear predictions, other endurance-related calculations, such as throttling, wear leveling, and data retention estimates, can be adjusted accordingly. The rate at which these adjustments are measured and applied should be small enough to react to incorrect predictions, but not so frequent as to slow down operation.

Figure 7:
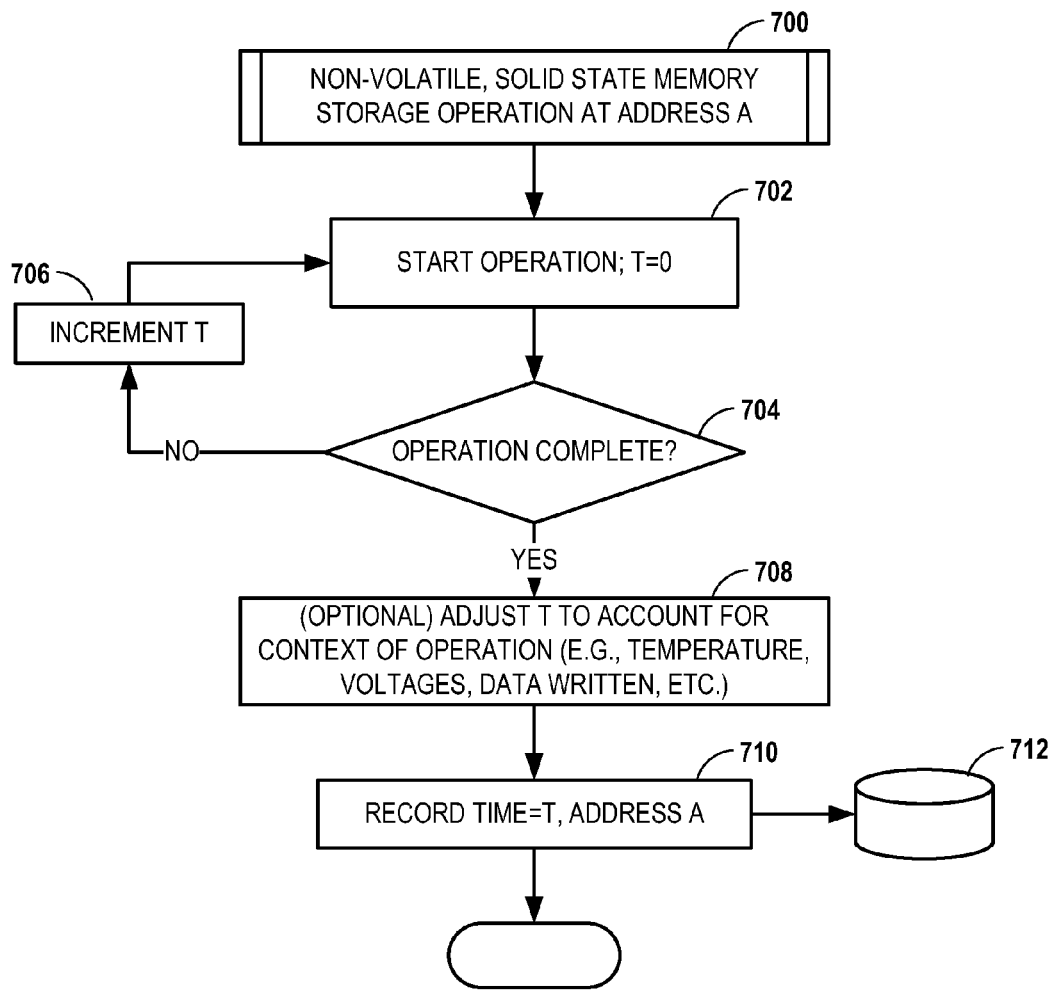
FIG. 7 is a flowchart of a procedure for measuring completion times of storage/access operations according to an example embodiment.

In reference now to FIG. 7, a flowchart illustrates a procedure 700 used to gather times for use in wear prediction/estimation according to an example embodiment. The procedure 700 may be included as part of all data storage operations of a particular type (e.g., write) or may be invoked only in response to particular events. For example, during periods of low activity, a controller may scan some or all portions of a non-volatile, solid-state memory device using the procedure 700 in order to collect and apply wear statistics related to the device. As indicated, the procedure 700 is directed to an address A, and this could be a logical and/or physical address, and may refer to a single addressable element (e.g., flash memory page) or a range of addresses (e.g., an erasure/garbage collection block). The procedure 700 can be performed on any combination of random blocks, blocks currently available for reading/writing/erasure, or a fixed/predetermined order of blocks/pages.

In block 702, the operation (e.g., read/write/erase) is started and a timer is initiated. The procedure may regularly check 704 (e.g., poll) for the operation to complete, with the timer being incremented 706 until the operation is complete. Once the operation has completed, the timer will be stopped (or elapsed time otherwise determined) and the time may optionally be adjusted 708 to account for factors such as media temperature, read/write/erase voltages, content of the data written, etc. These factors may be applied to form a generic/adjusted elapsed time that is proportional to wear and comparable to other time measurements regardless of the context in which they were made.

The recorded time and address of the targeted operation is then recorded 710 to a database, e.g., persistent storage. The recorded time 710 may be linked/indexed within the database 712 to the address itself, and/or some larger component (e.g., block, die) in which the targeted address resides. The elapsed time may be independently stored 710 in the database 712, or be combined with existing data related to the address/block to update a statistical value related to the address/block. This database 712 may also be linked or otherwise correlate to another database (e.g., database 806 in FIG. 8) that tracks wear metrics such as PE cycles.

Figure 8A:
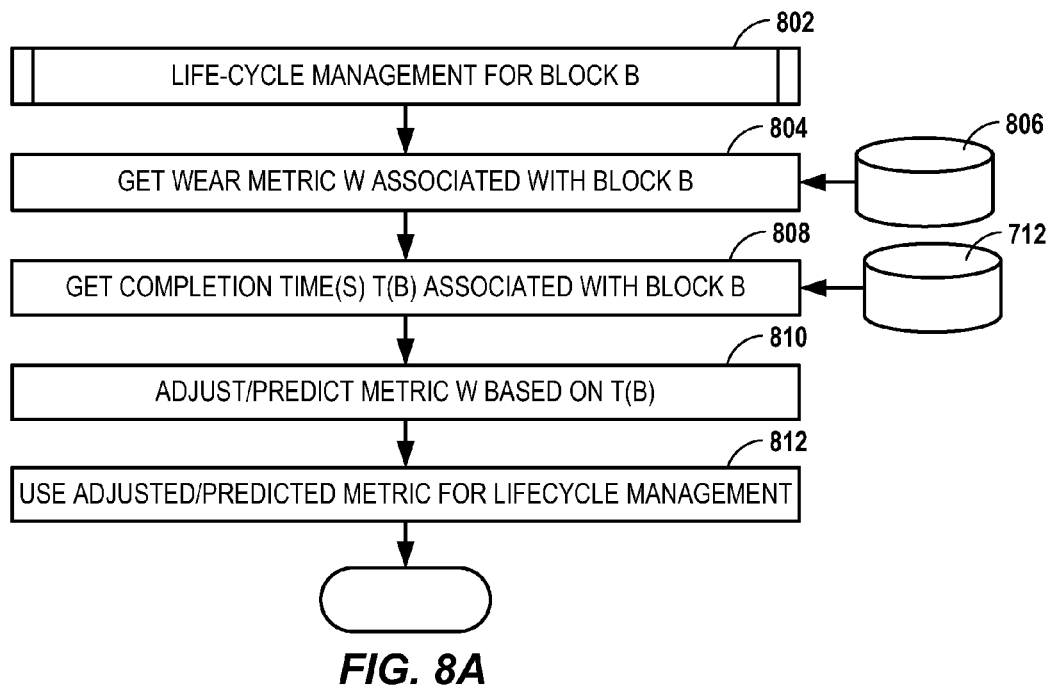
FIGS. 8A-8B are flowcharts of procedures using completion times of storage/access operations to manage life-cycle of a memory device according to an example embodiment.
Figure 8B:
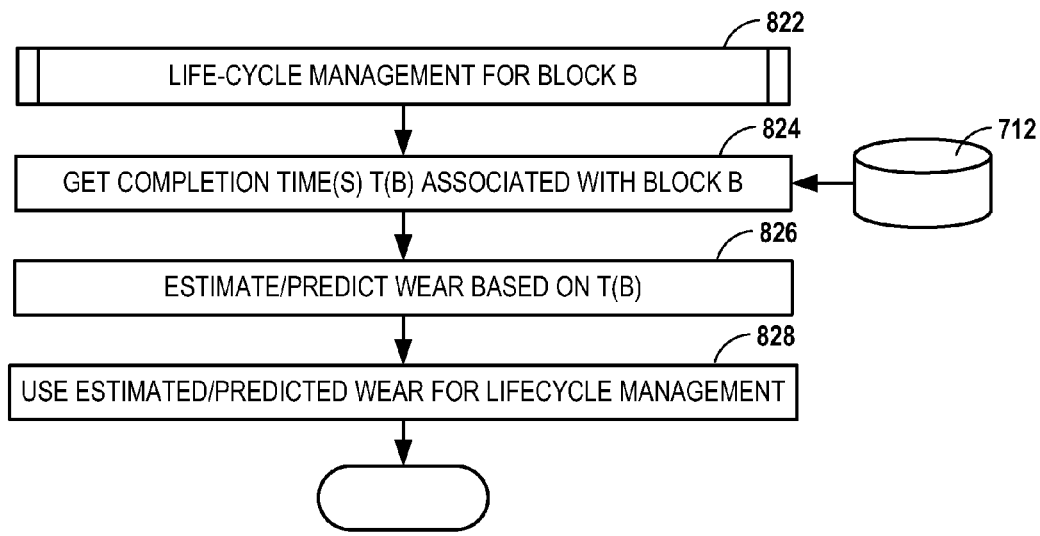

The data gathered in database 712 can be used, for example as shown in life cycle management procedures 802, 822 of FIGS. 8A and 8B according to example embodiments. Both of these procedures 802, 822 may be applied to a memory Block B, which may include any number of addressable elements. In some devices, it may be more efficient to characterize wear of fairly large blocks of memory based on measuring statistically significant samples within the blocks. These samples may be combined to form a composite wear value for the block dynamically and/or as stored in the database 712.

In procedure 802, an existing wear metric W associated with the target Block B is retrieved from database 806. The wear metric W, which may include metrics such as PE cycles, write-verify cycles, etc., may also be averaged or otherwise statistically combined from smaller samples within the block to form a composite value. In such a case, the composite value W is then used to characterize wear of the whole Block B. Completion times associated with Block B are retrieved 808 from database 712, and an adjusted and/or predicted metric compatible with metric W is created 810. The adjusted/predicted metric W can then be used for lifecycle management functions 812 of a device in which Block B resides.

Procedure 822 is similar to procedure 802 in the retrieval 824 of completion times from database 712. However, instead of augmenting an existing metric, these times are used without such metrics to estimate/predict wear 826, and use the estimations/predictions for lifecycle management 828 of a memory device. Examples of lifecycle management functions 822, 828 include, but are not limited to, providing user feedback of current wear and/or predicted life, wear leveling, removing blocks from service for excessive wear, differentiating data stored on the blocks due to high levels of wear, accounting for data retention times, etc.

Figure 9:
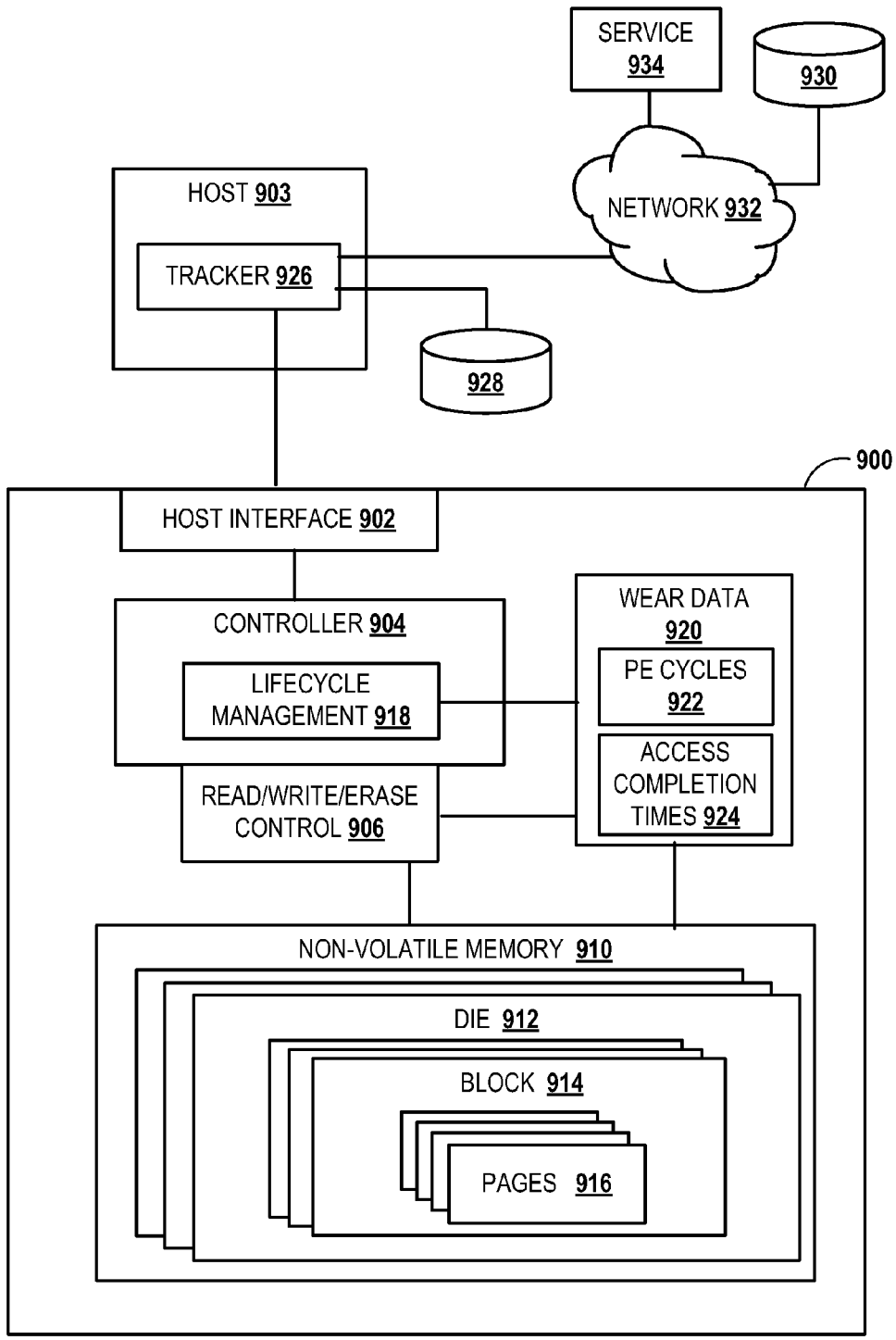
FIG. 9 is a block diagram of an apparatus/system according to an example embodiment.

In reference now to FIG. 9, a block diagram illustrates an apparatus/system 900 which may incorporate features of the embodiments described herein. The apparatus 900 may include any manner of persistent storage device, including a solid-state drive (SSD), thumb drive, memory card, embedded device storage, etc. A host interface 902 may facilitate communications between the apparatus 900 and a host device 903, e.g., server, personal computer, mobile device, set top box, media player, industrial controller, etc. For example, the apparatus 900 may be configured as an SSD, in which case the interface 902 may be compatible with standard hard drive data interfaces of the host 903, such as Serial Advanced Technology Attachment (SATA), Small Computer System Interface (SCSI), Integrated Device Electronics (IDE), etc.

The apparatus 900 may include one or more controllers 904, which may be general- or special-purpose processors or logic circuits that perform operations of the apparatus 900. The controller 904 may include any combination of microprocessors, digital signal processor (DSPs), application specific integrated circuits (ASICs), field programmable gate arrays (FPGAs), or other equivalent integrated or discrete logic circuitry suitable for performing the various functions described herein. Among the functions of the controller 904 are providing access (e.g., read/write/erase) to non-volatile, solid-state memory 910, which is represented here by read/write/erase control module 906. The module 906 may be implemented as part of the controller 904 or a separate physical component. For example, the module 906 may include functions of a write state machine such as described in relation to FIG. 1B.

The non-volatile memory 910 includes the circuitry used to persistently store both user data and other data managed internally by apparatus 900. The non-volatile memory 910 may include one or more non-volatile, solid state memory dies 912, which individually contain a portion of the total storage capacity of the apparatus 900. The dies 912 may be stacked to lower costs. For example, two 8-gigabit dies may be stacked to form a 16-gigabit die at a lower cost than using a single, monolithic 16-gigabit die. In such a case, the resulting 16-gigabit die, whether stacked or monolithic, may be used alone to form a 2-gigabyte (GB) drive, or assembled with multiple others in the memory 910 to form higher capacity drives. The dies 912 may be flash memory dies, or some other form of non-volatile, solid state memory.

The memory contained within individual dies 912 may be further partitioned into blocks 914. The blocks 914 may indicate partitions within the dies for purposes such as erasure, in which case the blocks 914 may represent the smallest individually erasable portions of memory 910. The blocks 914 include a number of pages 916 that represent the smallest portion of data that can be individually programmed or read. In a NAND configuration, for example, the page sizes may range from 512 bytes to 4 kilobytes (KB), and erasure block sizes may range from 16 KB to 512 KB. Further, the pages 916 may be in a multi-plane configuration, such that a single read operation retrieves data from two or more pages 916 at once, with corresponding increase in data read in response to the operations. It will be appreciated that the present invention is independent of any particular size of the pages 916 and blocks 914, and the concepts described herein may be equally applicable to smaller or larger data unit sizes.

The control module 906 may assist with lifecycle management functions, here represented as module 918. The lifecycle management module 918 may include one or more functional blocks that perform services such as wear leveling, end-of-life predictions based on wear of the memory 910, removal of worn memory units 912, 914, 916 from service, etc. The lifecycle management module 918 may maintain persistent storage of data 920 related to these management functions. This data 920 is designated as "wear data," and may include indicators such as PE cycles 922 and completion times 924 of data access operations targeted to the memory 910. This data 920 may be used for other purposes besides detecting/predicting wear, and may be stored together with other data, such a usage patterns, operating temperatures, etc., that may or may not be used to characterize wear of the memory 910.

The wear data 920 may at least be used internally to more accurately predict wear of the memory media 910. This data 920 may be usefully applied to a wide population of devices, such as all fielded units with similar memory hardware 910. In one embodiment, a tracker component 926 may operate on the host 903 (or elsewhere, such as within the device 900) and collect wear data 920 for storage to a local database 928 and/or a remote database 930 accessible via a network 932. The tracker 926 may read the data 920 via the host interface 902 or some alternate interface (not shown). Generally, the data 920 may provide data useful to a population of devices similar to 900, such as current read/write/erase times versus PE cycles of the memory 910. This data 920, 928, 930 may be further processed depending on the intended use, e.g., to summarize and/or anonymize the data, correlate completion times to PE cycles, correlate the completion time data to other usage data, etc. A centralized service 934 may use this processed data 920, 928, 930 to update wear prediction algorithms for lifecycle management, both in device 900 and similar, operational and/or newly manufactured devices.

This service 934 may also form improved data models usable for predicting and improving wear estimations of a population of devices that have equivalent memory to memory 910 of apparatus 900. These improved models may include modifications to completion-time vs. cycle curves such as seen in FIG. 4A, and/or modify how measurements are applied to specification data as seen in FIG. 4B. The improved models may also include other algorithms or data that modifies how life cycle is managed using data storage completion time measurements, such as modifying at which milestones wear estimation is applied. Data describing these changes (e.g., configuration data and/or program code) can be disseminated back out to these devices to further improve life cycle management.

The foregoing description of the example embodiments has been presented for the purposes of illustration and description. It is not intended to be exhaustive or to limit the invention to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. An apparatus comprising:
a controller capable of being coupled to a non-volatile, solid-state memory device, the controller configured to cause the apparatus to:
measure completion times of data storage operations targeted to the memory device;
compare an average and a confidence interval of the measured completion times with a baseline average and a baseline confidence interval of baseline completion times for other equivalent memory devices to estimate wear of the memory device; and
perform life cycle management operations to affect subsequent wear of the memory device in accordance with the estimated wear.

2. The apparatus of claim 1, wherein the baseline completion times result from applying a predetermined number equivalent data storage operations to the other equivalent memory devices.

3. The apparatus of claim 1, wherein the data storage operations comprise data programming operations targeted to the memory device.

4. The apparatus of claim 1, wherein estimating wear of the memory device using the measured completion times comprises adjusting a wear metric using the measured completion times, wherein the wear metric includes at least a count of program-erase cycles.

5. The apparatus of claim 1, wherein measuring completion times comprises measuring the completion times of the data storage operations targeted to a representative subset of memory units of the memory device, and wherein the estimated wear is used to manage the life cycle of memory units of the memory device that are not in the subset.

6. The apparatus of claim 1, wherein the life cycle management operations comprise wear leveling operations performed in accordance with the estimated wear.

7. The apparatus of claim 1, wherein the life cycle management operations comprise predicting an end of service life of the memory device in accordance with the estimated wear.

8. The apparatus of claim 1, wherein the life cycle management operations comprise selecting new data for writing to the cells in accordance with the estimated wear and in accordance with characteristics of the new data that influence the wear of the memory device.

9. The apparatus of claim 1, wherein comparing the completion times with the baseline completion times to estimate the wear of the memory device comprises estimating wear based further on a context of the data storage operation, wherein the context includes one or more of a programming voltage, a temperature of the memory device, and content of the data storage operations.

10. A method comprising:
measuring completion times of data storage operations targeted to a non-volatile, solid-state memory device;
comparing an average and a confidence interval of the measured completion times with a baseline average and a baseline confidence interval of baseline completion times for other equivalent memory devices to estimate wear of the memory device; and performing life cycle management operations to affect subsequent wear of the memory device in accordance with the estimated wear.

11. The method of claim 10, wherein the baseline completion times result from applying a predetermined number equivalent data storage operations to the other equivalent memory devices.

12. The method of claim 10, wherein the data storage operations comprise data programming operations targeted to the memory device.

13. The method of claim 10, wherein estimating wear of the memory device using the measured completion times comprises adjusting a wear metric using the measured completion times, wherein the wear metric includes at least a count of program-erase cycles.

14. The method of claim 10, wherein the life cycle management operations comprise wear leveling operations performed in accordance with the estimated wear.

15. The method of claim 10, wherein the life cycle management operations comprise predicting an end of service life of the memory device in accordance with the estimated wear.

16. The method of claim 10, wherein the life cycle management operations comprise selecting new data for writing to the cells in accordance with the estimated wear and in accordance with characteristics of the new data that influence the wear of the memory device.

17. A system comprising:
a non-volatile, solid-state memory device; and a controller coupled to the memory device and configured to cause an apparatus to:
measure completion times of programming operations targeted to units of the memory device;
compare an average and a confidence interval of the measured completion times with a baseline average and a baseline confidence interval of baseline completion times for other equivalent memory devices to determine wear metrics of the targeted units, wherein the wear metrics includes at least program-erase cycles applied to the targeted units
adjust the wear metrics of the targeted memory units using the measured completion times; and
manage a life cycle of the memory device using the adjusted wear metrics.

18. The system of claim 17, further comprising a centralized database configured to:
gather, from the apparatus and other apparatuses having equivalent non-volatile, solid-state memory devices, the measured completion times correlated with the wear metrics;
form an improved data model for estimating of wear using the measured completion times in response to gathering the measured completion times correlated to the wear metrics;
send data describing the improved data model to the apparatus and the other apparatuses, wherein the apparatus and the other apparatuses adjust the wear metrics of the targeted memory units using the measured completion times in accordance with the improved data model.

* * * * *